(12) United States Patent
Yount, Jr.

(10) Patent No.: US 6,321,371 B1
(45) Date of Patent: Nov. 20, 2001

(54) INSERTION OF SPARE LOGIC GATES INTO THE UNUSED SPACES BETWEEN INDIVIDUAL GATES IN STANDARD CELL ARTWORK

(75) Inventor: Harold H. Yount, Jr., Fort Collins, CO (US)

(73) Assignee: Agilent Technologies, Inc., Palo Alto, CA (US)

( * ) Notice: Subject to any disclaimer, the term of this patent is extended or adjusted under 35 U.S.C. 154(b) by 0 days.

(21) Appl. No.: 09/346,568

(22) Filed: Jul. 1, 1999

(51) Int. Cl.[7] ...................................................... G06F 17/50
(52) U.S. Cl. ................................................................ 716/17
(58) Field of Search ..................................... 716/1, 12, 17

(56) References Cited

U.S. PATENT DOCUMENTS 6,209,118 * 3/2001 LaBerge .................................. 716/17

\* cited by examiner

*Primary Examiner*—Trong Phan

(57) ABSTRACT

Apparatus for placing and routing an integrated circuit, the apparatus comprising one or more computer readable storage media. Computer readable program code is stored in the one or more computer readable storage media. The computer readable code comprises code for placing a plurality of logic cells in the integrated circuit and code for placing one or more spacer cells in the integrated circuit to fill one or more empty spaces between the plurality of logic cells. The one or more spacer cells comprise a spare logic gate.

22 Claims, 7 Drawing Sheets

INSERTION OF SPARE LOGIC GATES INTO THE UNUSED SPACES BETWEEN INDIVIDUAL GATES IN STANDARD CELL ARTWORK

FIELD OF THE INVENTION

The present invention relates generally to the field of integrated circuits, and more particularly, to a method and apparatus for inserting spare logic gates into the unused spaces between individual gates in standard cell artwork.

BACKGROUND OF THE INVENTION

Electronic devices including computers, televisions, and telephones require integrated circuits to operate. An integrated circuit (IC) is an interconnected array of active and passive electronic elements, such as transistors and resistors, formed on a semiconductor substrate and generally housed in a plastic or ceramic package. Electrical connectors or pins pass through the package to connect the integrated circuit with an external electrical circuit.

As electronic devices become faster, smaller, and perform more complex functions, the integrated circuits likewise become more complex. It is extremely difficult to design a very complex integrated circuit, which may include millions of transistors and run at hundreds of megahertz, or hundreds of millions of cycles each second. The logic, or functional design, of the integrated circuit is first produced, then a network of logic gates is planned to implement the logic design. A logic gate is typically a small block of transistors and other circuit elements, grouped to perform a certain logic operation. The resulting network of logic gates is generally described in a netlist, a list of logic gates and their interconnections which implement the logic design, but which usually does not describe the physical layout of the circuit.

A place and route software tool is generally used to create the physical layout, or artwork, of the integrated circuit from the netlist. The place and route software requires a library file containing a set of predefined logic cells or blocks to implement the network of logic gates defined in the netlist. Each logic cell may contain the physical description of power and ground conductors and the field effect transistors (fets) needed to form one or more logic gates.

Typical place and route software first places all logic cells in a stack in the center of the circuit area. The logic cells are then moved apart by the software to resolve overlaps. The software then performs a global routing operation, in which the logic cells are further moved apart to allow room for routing wires between the logic cells, without actually placing any wires. Most place and route software moves the logic cells apart by placing spacer cells between the logic cells, where a spacer cell (logic-free) contains some minimal routing for power and ground, and possibly one or more bypass capacitors between the power and ground wires. A routing operation then places the electrical wires, or electrical routing, in one or more layers between the logic cells according to the netlist.

Referring now to FIG. 1, a logic-free spacer cell 10 may be formed on a silicon wafer in a standard CMOS process. Basically, a CMOS integrated circuit is formed on the silicon wafer in a series of levels or steps, including n-well (e.g., 20), n-well active (e.g., 22), non n-well active (e.g., 24), polysilicon (polycrystalline silicon) (e.g., 16), and metal (e.g., 12 and 14), with connections from active to polysilicon (e.g., 26 and 34) and from polysilicon to metal (e.g., 30 and 32). The intersections between polysilicon traces and n-well active form pfets (p-type field effect transistors), and the intersections between polysilicon traces and non n-well active form nfets (n-type fets).

The logic-free spacer cell 10 comprises a power conductor 12, a ground conductor 14, and a bypass capacitor 16. Power 12 and ground 14 are formed in the metal layer of the integrated circuit, with an n-well 20 formed at the top of the cell 10. An n-well active region 22 underlies power 12 inside the n-well 20, and a non n-well active region 24 underlies ground 14. The bypass capacitor 16 comprises a very large fet formed in the polysilicon, or poly, layer over gate oxide which acts as a dielectric for the capacitor between power 12 and ground 14. The n-well active region 22 is connected to power 12 with several connectors 26 and 28. The poly bypass capacitor 16 is connected to power 12 with several connectors 30 and 32. The non n-well active region 24 is connected to ground 14 by several connectors 34, 36, and 38. The capacitance between power 12 and ground 14 helps prevent power spikes or fluctuations in the integrated circuit, but does not perform any logic functions in the circuit.

As an integrated circuit is designed, its operation is simulated on a computer to try to find logic faults. An integrated circuit is usually simulated both at the netlist stage and after a physical layout has been created. However, fully simulating every possible state of a complex integrated circuit is virtually impossible. The circuit designer and tester create a test that is as nearly complete as possible under time and budget constraints, but fully simulating every possible state in an integrated circuit would be expensive, if even possible. Furthermore, simulators may not reproduce all faults caused by the physical layout of the circuit. For example, the design logic of a circuit may be correct, but if two high-speed electrical wires are placed too closely together, they may be coupled by electromagnetic fields. That is, a signal on one wire may induce a signal to appear on the other, resulting in errors during operation of the integrated circuit. Functional tests on a fabricated integrated circuit are therefore used to supplement simulations.

Faults in the design logic or in the physical layout of a very complex integrated circuit are very common the first time the circuit is fabricated. Designers and fabricators of integrated circuits have several methods of correcting these faults without completely redesigning the physical layout. An integrated circuit is fabricated in a series of steps, forming the logic gates (made up of transistors) and other elements on a semiconductor substrate first, then forming multiple layers of routing interconnecting the transistors and other elements. By including spare logic gates in the original artwork, logic changes can be made by altering the routing, leaving the placement of the logic gates unchanged.

In one method for including spare logic gates, a "fet-farm" is created, in which an area is created outside the standard cell artwork containing an array or "farm" of fets, or transistors. The standard cell artwork consists of the logic and spacer cells and routing needed to implement the netlist.

The fets in the fet-farm are "tied down," or connected to power and/or ground so as to hold them in a given state, preventing them from randomly fluctuating or floating. This solution has a significant disadvantage in that few routing resources remain in the standard cell artwork allowing fets in the farm to be connected to cells within the standard cell artwork. The place and route operation attempts to place logic cells as closely as possible within the circuit in order to minimize the size of the circuit and increase the maximum operating speed of the circuit. This reduces the area left in the artwork available for placing new routing. Furthermore, fet-farms limit the speed of the circuit, since a signal must travel an undesirably large distance across the circuit between the farm and logic cells deep in the circuit. Finally, a fet-farm increases the size of an integrated circuit.

In another method for including spare logic gates, known as "happy-gates," spare logic gates are specifically added to the integrated circuit by the designer so that they appear in the netlist. The standard place and route software then places the happy-gate logic cells corresponding to the spare logic gates into the standard cell artwork, making them somewhat more accessible to standard cells than in the fet-farm technique. Thus the place and route software places the original logic cells, the happy-gate logic cells, and the logic-free spacer cells in the standard cell artwork.

A typical happy-gate logic cell 40 is illustrated in FIG. 2. To create this happy-gate logic cell 40, a two-input nand gate is included in the netlist for the integrated circuit, with one input tied to ground and the other tied to power so that the output is high, rather than floating. The place and route software reads the netlist and includes the standard logic cell 40 for a two-input nand, with a first input 42 tied to power 44 through a metal trace 46, a second input 50 tied to ground 52 through a metal trace 54, and an output 56 which does not connect to any other logic cell in the integrated circuit.

The "happy-gate" method, however, is becoming less useful. As place and route algorithms have improved, the algorithms correctly place the happy-gate logic cells near the edges of the block since they do not tie into the logical circuitry of the integrated circuit. As the spare happy-gate logic cells move further toward the block edges, this technique devolves to the same poor level of usability as the fet-farm approach. Furthermore, this technique requires manipulation of the circuit's netlist prior to routing, adding complexity to the design process. Finally, this technique also increases the size of the integrated circuit by adding extra cells to the artwork.

A need therefore exists for a system for inserting logic cells containing spare logic gates into the standard cell artwork of an integrated circuit, making the spare logic gates accessible to standard cells in the artwork. A need also exists for a system for inserting spare logic gates into existing space in an integrated circuit, providing access to spare gates without increasing the size of the circuit. A need further exists for a system for automatically inserting spare logic gates into an integrated circuit without manipulating the netlist.

SUMMARY

To assist in achieving the aforementioned needs, the inventor has devised a system for inserting spare logic gates into the standard cell artwork of an integrated circuit. The place and route software may insert the spare logic gates automatically, without the need to manipulate the netlist, and without increasing the size of the circuit or the standard cell artwork.

The invention may comprise an apparatus for placing and routing an integrated circuit having one or more computer readable storage media. Computer readable program code is stored in the one or more computer readable storage media. The computer readable code comprises code for placing a plurality of logic cells in the integrated circuit and code for placing one or more spacer cells in the integrated circuit to fill one or more empty spaces between the plurality of logic cells. The one or more spacer cells comprise a spare logic gate.

The invention may also comprise a method for designing an integrated circuit having spare logic gates. A plurality of logic cells is placed on an area of the integrated circuit. A plurality of spacer cells is placed among said plurality of logic cells to fill a plurality of empty spaces between the plurality of logic cells. A plurality of electrical connections is then routed among the plurality of logic cells and the plurality of spacer cells to form the integrated circuit.

The invention may also comprise a method of manufacturing an integrated circuit, comprising placing and routing a plurality of logic cells and a plurality of spacer cells in an integrated circuit design. The spacer cells comprise one or more spare logic gates configured in an inactive state. One or more integrated circuits is then fabricated according to the integrated circuit design.

The invention may also comprise a computer program for designing an integrated circuit, comprising a means for spreading a plurality of logic cells apart in an integrated circuit design with a plurality of spacer cells, the spacer cells comprising one or more spare logic gates.

BRIEF DESCRIPTION OF THE DRAWING

Illustrative and presently preferred embodiments of the invention re shown in the drawing, in which.

DESCRIPTION OF THE PREFERRED EMBODIMENT

Figure 1:
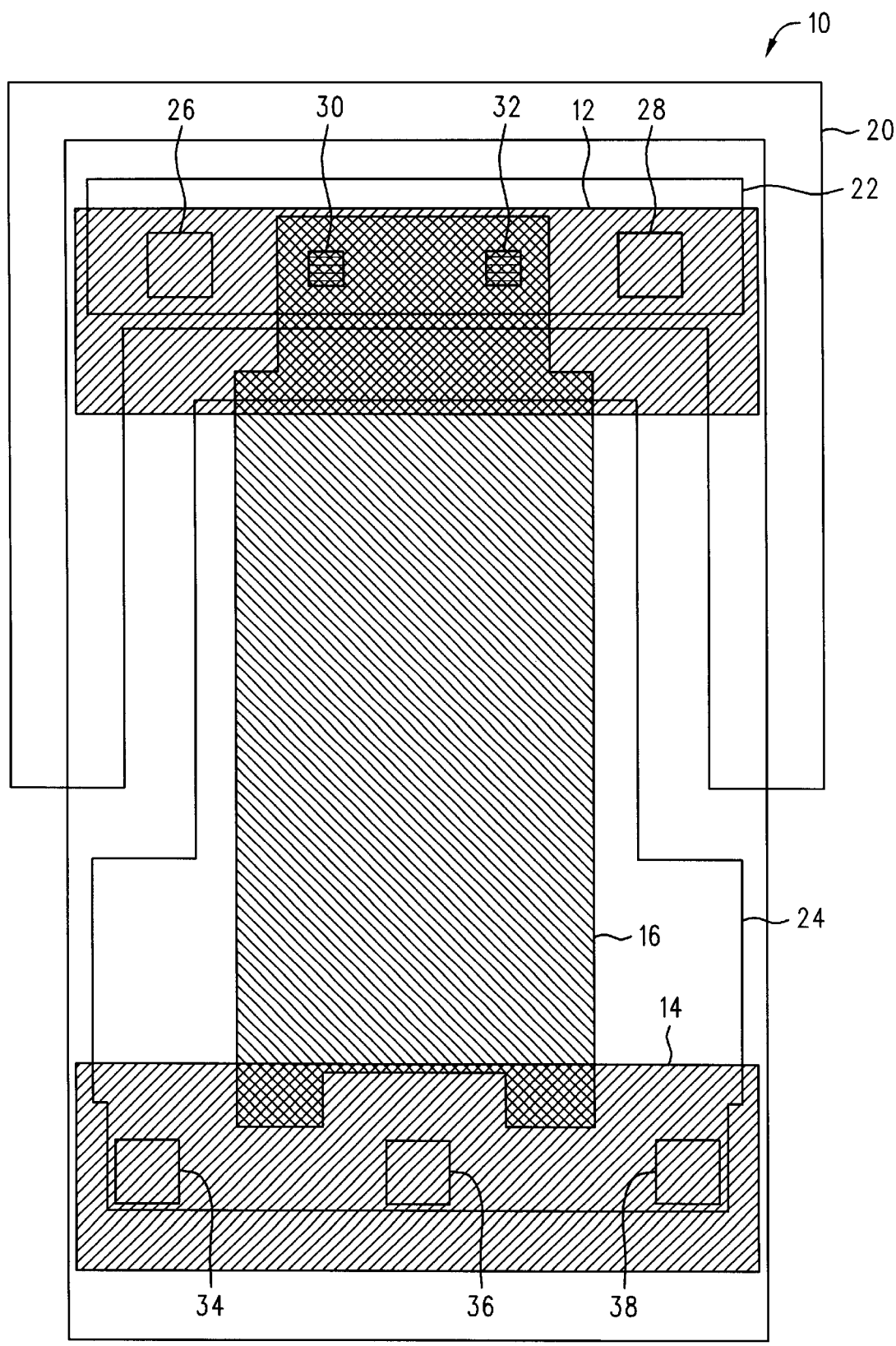
FIG. 1 is a schematic representation of an empty spacer cell to be used by place and route software during the design of an integrated circuit.
Figure 2:
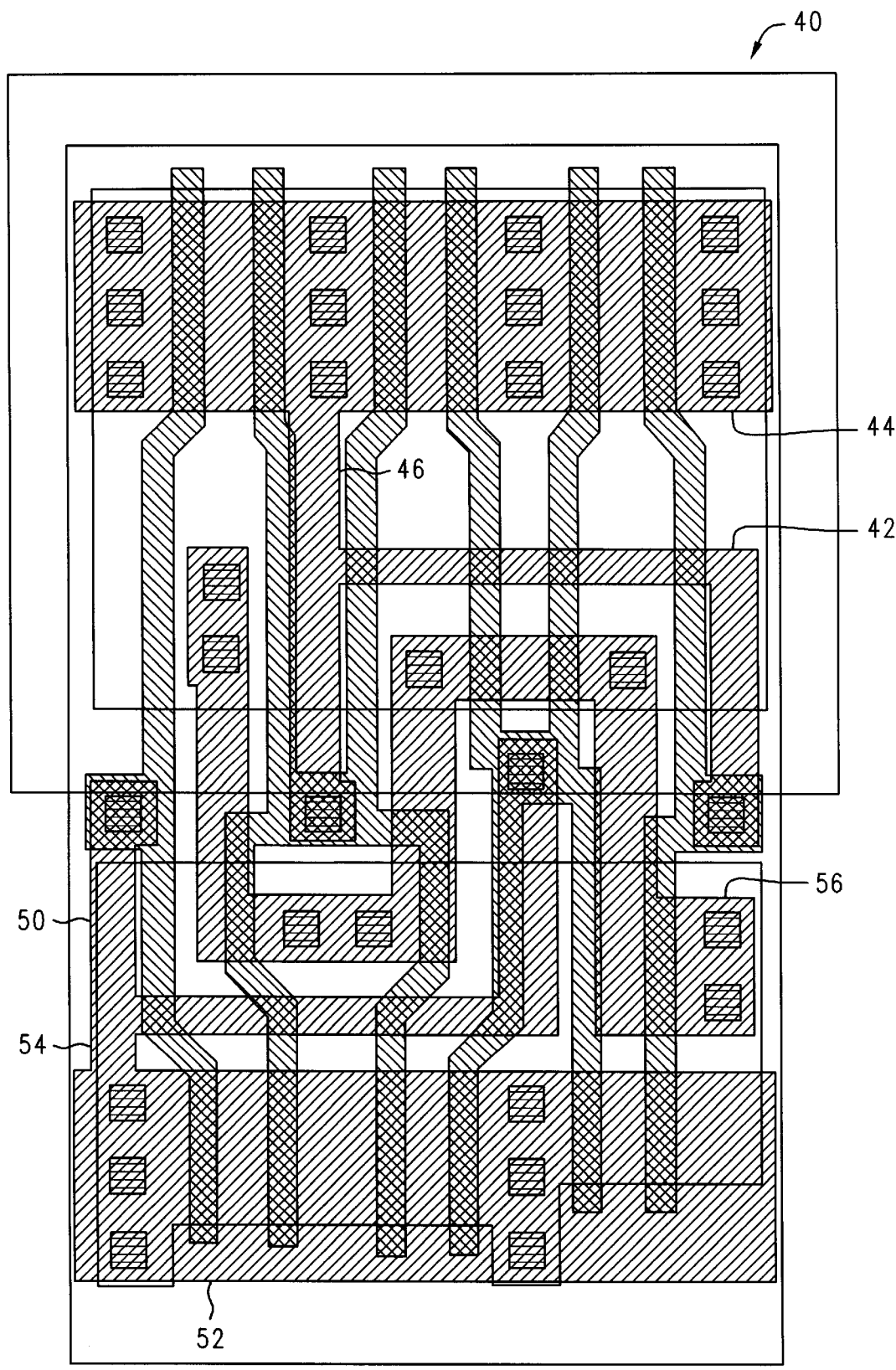
FIG. 2 is a schematic representation of a "happy-gate" type spare logic cell with the fet inputs tied to ground and power and with the fet outputs floating.

The drawing and description, in general, disclose an apparatus for placing and routing an integrated circuit, the apparatus comprising one or more computer readable storage media. Computer readable program code is stored in the one or more computer readable storage media. The computer readable code comprises code for placing a plurality of logic cells in the integrated circuit and code for placing one or more spacer cells (e.g., 90 FIG. 5) in the integrated circuit to fill one or more empty spaces between the plurality of logic cells. The one or more spacer cells (e.g., 90 FIG. 5) comprise a spare logic gate.

The drawing and description also disclose a method for designing an integrated circuit having spare logic gates. A plurality of logic cells is placed on an area of the integrated circuit. A plurality of spacer cells (e.g., 90 FIG. 5) is placed among said plurality of logic cells to fill a plurality of empty spaces between the plurality of logic cells. A plurality of electrical connections is then routed among the plurality of logic cells and the plurality of spacer cells (e.g., 90 FIG. 5) to form the integrated circuit.

Spare logic gates may be inserted into the standard cell artwork of an integrated circuit during the place and route process by replacing standard empty spacer cells with spacer cells containing spare logic gates. The place and route software used to design the integrated circuit will then automatically distribute the spacer cells throughout the standard cell artwork without the need to modify the netlist.

For example, the "Silicon Ensemble"® or "Silicon Ensemble Deep Sub-Micron" place and route software available from the Cadence company of Mt. View, Calif. uses 12 logic-free spacer cells of varying widths to spread the logic cells required by the netlist. In the preferred embodiment, the four largest logic-free spacer cells are replaced by spacer cells containing spare logic gates. Each of the four spacer cells have the same height, while the width varies. The widest logic-free spacer cell is replaced with a spacer cell containing a two-input multiplexer (mux). The next widest logic-free spacer cell is replaced with a spacer cell containing a three-input nand gate, the next a two-input nand gate, and finally an inverter. The logic gates in the spacer cells are tied-down so that the outputs do not float. A floating output is one which floats at a voltage level between power and ground, but outside of the normal "on" or "off" voltage ranges. A floating output can cause undesirable faults or glitches in the operation of an integrated circuit and can drain power in the circuit. The remaining eight logic-free spacer cells are left in their original states, providing bypass capacitance and routing resources and filling narrow empty spaces.

It should be understood that the types, numbers, and sizes of spacer cells may be modified depending upon the needs of the designer and the requirements of the place and route software without departing from the inventive concepts disclosed herein. For example, any type of logic gate may be included in a spacer cell, and either more or less than four spacer cells may be replaced. Furthermore, the spacer cells with spare logic gates may be adapted for use with place and route software tools which do not use cells to fill the empty space. In this case, the place and route software may be adapted to automatically insert spare logic gates into the empty spaces between circuit logic gates in whatever process normally employed by the software.

The term integrated circuit is used herein to refer both to a physical, fabricated circuit and to the design of an integrated circuit. The term computer readable program code is used herein to refer not only to processor instructions but to other types of data such as cell libraries which include definitions or descriptions of physical attributes of integrated circuits.

In the example above, the Silicon Ensemble® software is initialized with a netlist and a library of logic and spacer cells, and is configured to use the four new spacer cells. The software reads the netlist and creates a stack of logic cells as required by the netlist. The software then shifts the logic cells apart to resolve overlaps, attempting to keep electrically connected logic cells as close together as possible. The place and route software then performs a global routing operation, determining how much space is needed between each logic cell to include the routing or wiring required by the netlist. Once the required space between two logic cells is determined, the software cycles through the available spacer cells, beginning with the widest, searching for the widest spacer cell which will provide the necessary space for the routing and fit in the empty space. This prevents multiple narrow spacer cells from being placed side by side. The logic cells and spacer cells are thus placed side by side and top to bottom so that the connected electrical conductors in each are touching and the routing is continuous where desired.

In this place and route process, the software will automatically spread spacer cells having spare logic gates throughout the integrated circuit in a fairly random fashion. With the new spacer cells spread reasonably uniformly throughout the circuit, it is likely that in the event of a logic error an appropriate spare logic gate will be in close proximity to the circuitry in need of modification.

When a batch of integrated circuit chips is fabricated it is preferable to completely fabricate only part of the batch, leaving the remainder of the batch only partially fabricated without the metal and connector stages. The connections tying the tied-down spacer cells to power and ground are made in the metal layers, which are not fabricated in the partially completed part of the batch. The partially completed chips can later be completed with the spacer cells either tied-down or fully connected to other logic cells. Once part of the batch is completely fabricated, the completed chips are tested. Unfortunately, design flaws are often found the first time a complex integrated circuit is fabricated and tested. The design flaw must then be corrected and new chips must be fabricated according to the corrected design.

The spacer cells with spare logic gates allow the design to be corrected and the partially fabricated chips to be completed according to the corrected design, saving time and money. To correct design flaws, the spare logic gates inserted during the place and route operation may be connected with the original circuit to implement the corrected logic design. To connect a spare logic gate, the spacer cell containing the desired spare logic gate is replaced with a corresponding internally fully connected logic gate. That is, the replacement spare logic gate is not tied down, but is connected internally so as to perform the desired logic function. The layers of the spare logic gate below the metal and connector layers are identical in the tied-down and fully connected versions. Therefore, the appropriate tied-down spacer cells are replaced with fully connected versions which can then be connected to other logic gates in the integrated circuit. The place operation does not need to be redone since the cell placement is unchanged.

The replacement and connection process can either be done manually or with the aid of the place and route software. If the required changes are small, the cell artwork can be manually modified. If relatively extensive changes are required, typical place and route software includes a mode in which cell placement remains locked and only the changed connections are rerouted.

Once the design flaw is corrected using the spare logic gates in the spacer cells, the partially fabricated chips can be completed using the new design. The metal routing according to the new design can be fabricated onto the partially fabricated chips, since the original layers below and including the polysilicon layers are constant between the two designs.

The spacer cells containing spare logic gates provide great benefits over prior methods of including spare logic gates in an integrated circuit. The spacer cells are automatically placed and distributed by the place and route software, eliminating the need for changes to the netlist or for manual placement of spare logic gates. The spacer cells do not increase the size of the integrated circuit, since they are already required to provide routing space. Furthermore, multiple types of spare logic gates are distributed reasonably uniformly throughout the integrated circuit, therefore it is likely that the routing resources needed to connect the spare logic gates will be available and that timing delays introduced by the new routing will be minimal. The spacer cells reduce the time required to correct design flaws and fabricate corrected chips, since the chips can be partially fabricated before a design fault is even detected. The place and route process is also greatly simplified, since only minor routing changes need to be made, and they can be made automatically with the replacement fully-connected spacer cells. Finally, fabrication of corrected chips is faster and cheaper since only the metal and connection layer photomasks need be changed, and the original photomasks for the lower layers remain unchanged.

Figure 3:
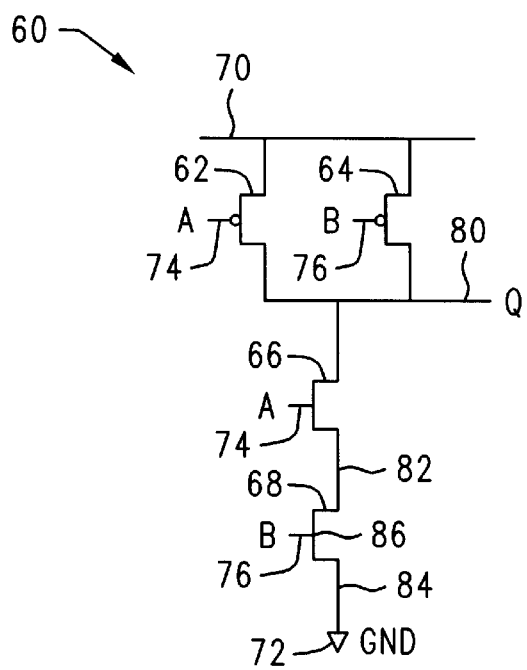
FIG. 3 is a schematic of a two input nand gate with a drive strength of one.

Referring now to FIG. 3, a two input nand gate 60 will be described as it can be included as a spare logic gate in a spacer cell. Two pfets 62 and 64 and two nfets 66 and 68 are connected between power 70 and ground 72. A fet 68 has a drain 82, a source 84, and a gate 86. When the gate 86 is active or on, electricity is allowed to flow between the drain 82 and the source 84. The gate of an nfet is active high, that is, a positive voltage is applied to the gate in order to connect the drain 82 and the source 84. The gate of a pfet is active low, that is, the gate is grounded to connect the drain and source.

A first input 74 is connected to the gates of a pfet 62 and an nfet 66, and a second input 76 is connected to the gates of a pfet 64 and an nfet 68. An output 80 is off, or low, only when both inputs 74 and 76 are on, or high. When both inputs 74 and 76 are on, the nfets 66 and 68 connect the output 80 to ground 72 and the pfets 62 and 64 are off, isolating the output 80 from power 70. When either or both of the inputs 74 and 76 are off, then either or both of the nfets 66 and 68 will be off, isolating the output 80 from ground 72, and either or both of the pfets 62 and 64 will be on, connecting the output 80 to power 70.

Figure 4:
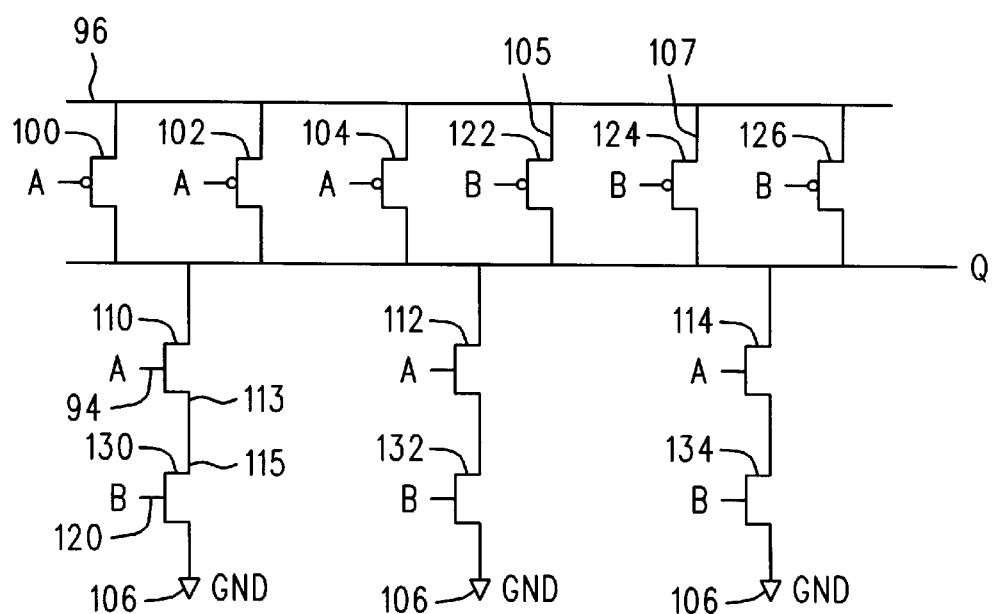
FIG. 4 is a schematic of a two input nand gate with a drive strength of three.
Figure 5:
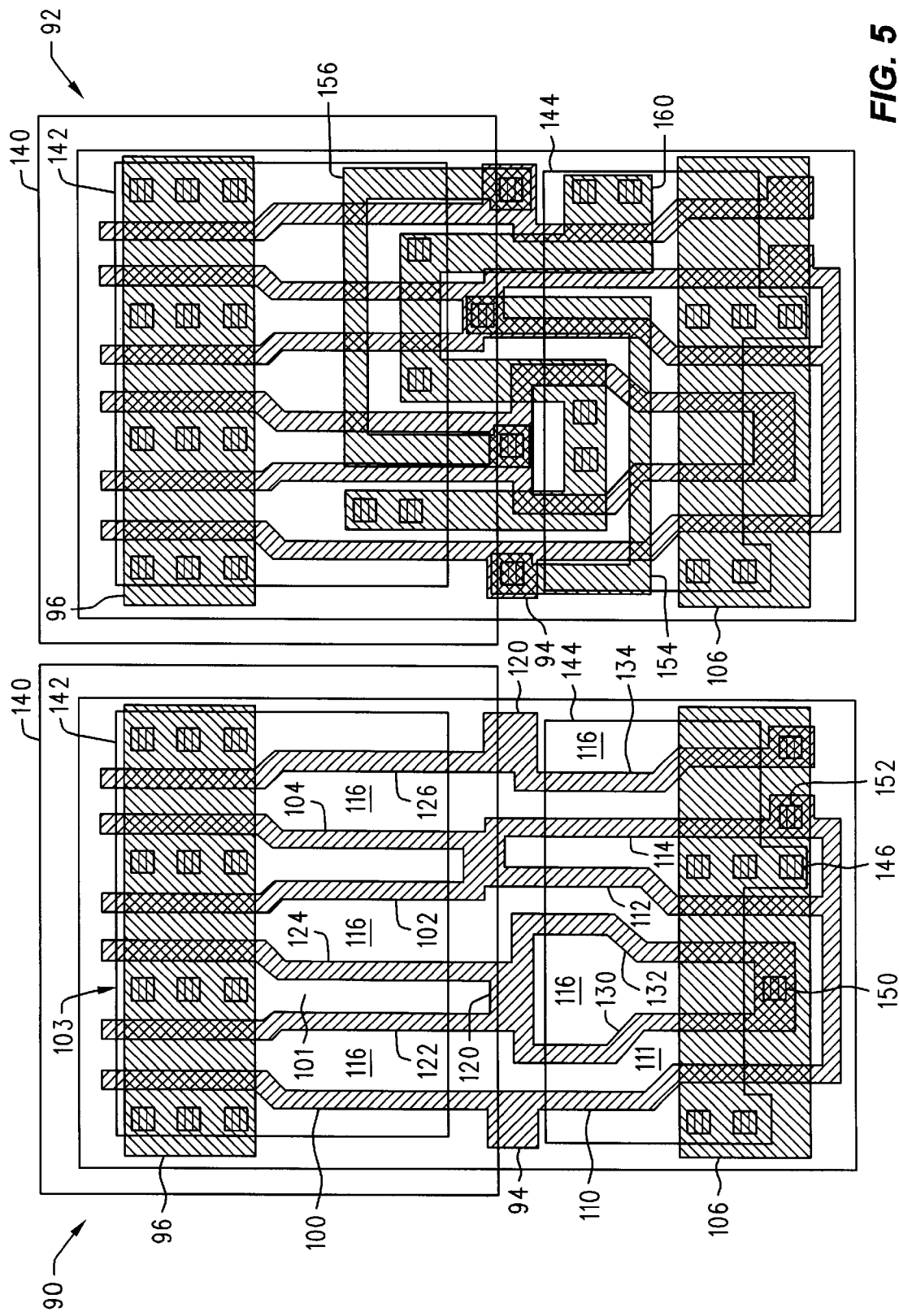
FIG. 5 is a schematic representation of a spacer cell with the two input nand gate of FIG. 4 in a tied-down configuration and in a fully-connected configuration.

Referring now to FIGS. 4 and 5, the schematic and cell artwork for a two input nand gate is displayed in the tied-down configuration 90 and the fully connected configuration 92. In order to increase the drive strength of the nand gate, twelve fets are used as compared with the four fets 62, 64, 66, and 68 illustrated in FIG. 3. An n-well 140 underlies a power conductor 96 and a set of pfets (e.g., 100, 122). An n-well active area 142 also underlies the power conductor 96 and the set of pfets (e.g., 100, 122), and a non n-well active area 144 underlies a ground conductor 106 and a set of nfets (e.g., 110, 130).

A first input 94 can connect an output 116 to power 96 through three parallel pfets 100, 102, and 104. A second input 120 can connect the output 116 to power 96 through three parallel pfets 122, 124, and 126. The output 116 can be connected to ground 106 through three parallel sets of two series nfets. In the first of the three parallel sets the first series nfet 110 is controlled by the first input 94 while the second series nfet 130 is controlled by the second input 120. In the second of the three parallel sets the first series nfet 112 is controlled by the first input 94 while the second series nfet 132 is controlled by the second input 120. In the third of the three parallel sets the first series nfet 114 is controlled by the first input 94 while the second series nfet 134 is controlled by the second input 120.

The active regions 142 and 144 comprise the sources and drains of the fets (e.g., 100, 110). The polysilicon traces forming the fets subdivide the active regions 142 and 144, insulating the sources and drains of the fets from each other.

For example, one portion 101 of the n-well active region which is connected to power 96 with a series of connectors 103 acts as the drains 105 and 107 of pfets 122 and 124, respectively. Another portion 111 in the non n-well active region 144 acts as the source 113 for nfet 110 and the drain 115 of nfet 130, which are connected as best seen in FIG. 4.

Note that the integrated circuit layers below and including the polysilicon are constant between the tied-down and fully-connected configurations 90 and 92. The element numbers shown in the drawing apply to both the tied-down and fully-connected configurations 90 and 92, but some element numbers are not repeated in the fully-connected configuration 92 to keep the drawing legible.

In the tied-down configuration 90 of the two input nand gate, the first input 94 is tied to ground 106 with a connector 146. The second input 120 is tied to ground 106 with two connectors 150 and 152. The output 116 will therefore be tied in a high state, but is left unconnected. The empty space in the metal and connector layers between power 96 and ground 106 may therefore be used for routing if desired when the spacer cell is in the tied-down configuration 90.

In the fully connected configuration 92 of the two input nand gate, the various fets (e.g., 100, 102, and 104) of the first input 94 are fully connected by a metal strap 154. The fets (e.g., 122, 124, and 126) of the second input 120 are fully connected by a second metal strap 156. The connections 146, 150 and 152 in the tied-down configuration 90 between the first and second inputs 94 and 120 and ground are removed in the fully connected configuration 92 so that the metal input straps 154 and 156 may be connected to other logic cells in the integrated circuit. The connections with other logic cells are preferably made on metal layers above the first metal layer, such as metal2 or metal3. The various locations of the output 116 are fully connected with a metal strap 160, which may be connected to other logic cells in the integrated circuit to modify the original logic design of the circuit.

Place and route software tools typically use library files containing the definitions for logic cells and spacer cells. The software is configured by an initialization file which specifies what logic cells and spacer cells to use. The following is an example of the lines included in an initialization file to cause the place and route software to use the new spacer cells with spare logic gates in place of the original logic-free spacer cells.

fillCells="fill_mux2neff_huge4 fill_nand3gg_huge3
fill_nand2ii_huge2 fill_invjj_huge1 fill_large2A
fill_large1A fill_small2A fill_small1"

Note that the first four spacer cells in the "fillcells" line above are replaced by the new spacer cells with spare logic gates, while the remaining four spacer cells are left original.

Figure 6:
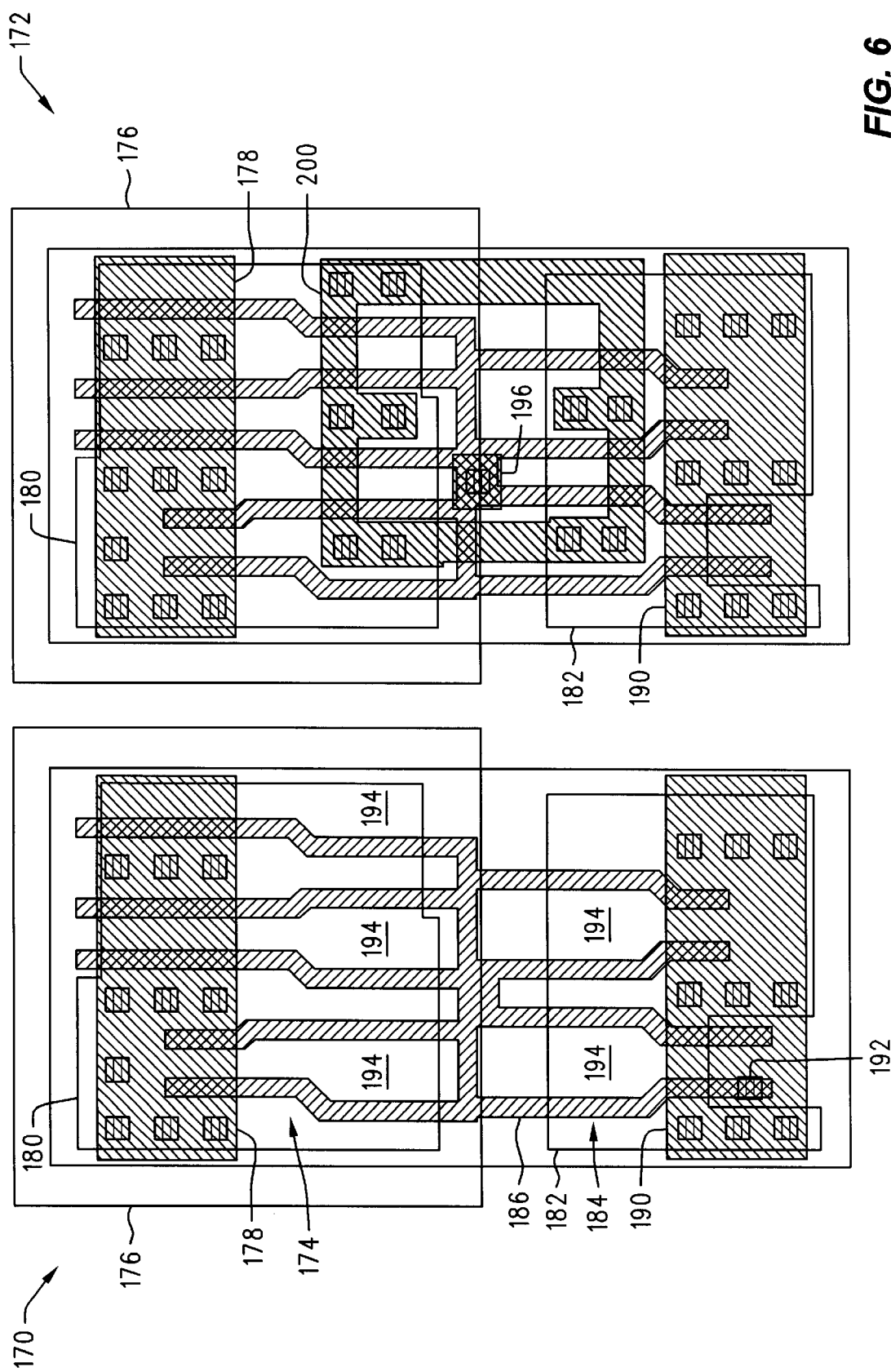
FIG. 6 is a schematic representation of a spacer cell with an inverter gate in a tied-down configuration and in a fully-connected configuration.

Three other exemplary spacer cells with spare logic gates will now be briefly described. A spacer cell with an inverter in both a tied-down configuration 170 and a fully connected configuration 172 is illustrated in FIG. 6. A series of polysilicon pfets 174 is located with a power conductor 178 in an n-well active region 180 inside an n-well 176, and a series of polysilicon nfets 184 is located with a ground conductor 190 in a non n-well active region 182. In the tied-down configuration 170, the input 186 is tied to ground 190 by a metal connector 192. The unconnected outputs 194 are therefore held in a high state, preventing them from floating. In the fully connected configuration 172, the metal connector 192 is removed and the input 186 is not tied down to ground 190. The input 186 may be connected to other logic cells by a metal strap 196. The output locations 194 are interconnected by a metal strap 196, and may be connected to other logic cells, preferably on another metal layer. As with the two input nand gate described previously, the structure of the spacer cell is identical below the metal and connector layers in the tied-down and fully-connected configurations.

Figure 7:
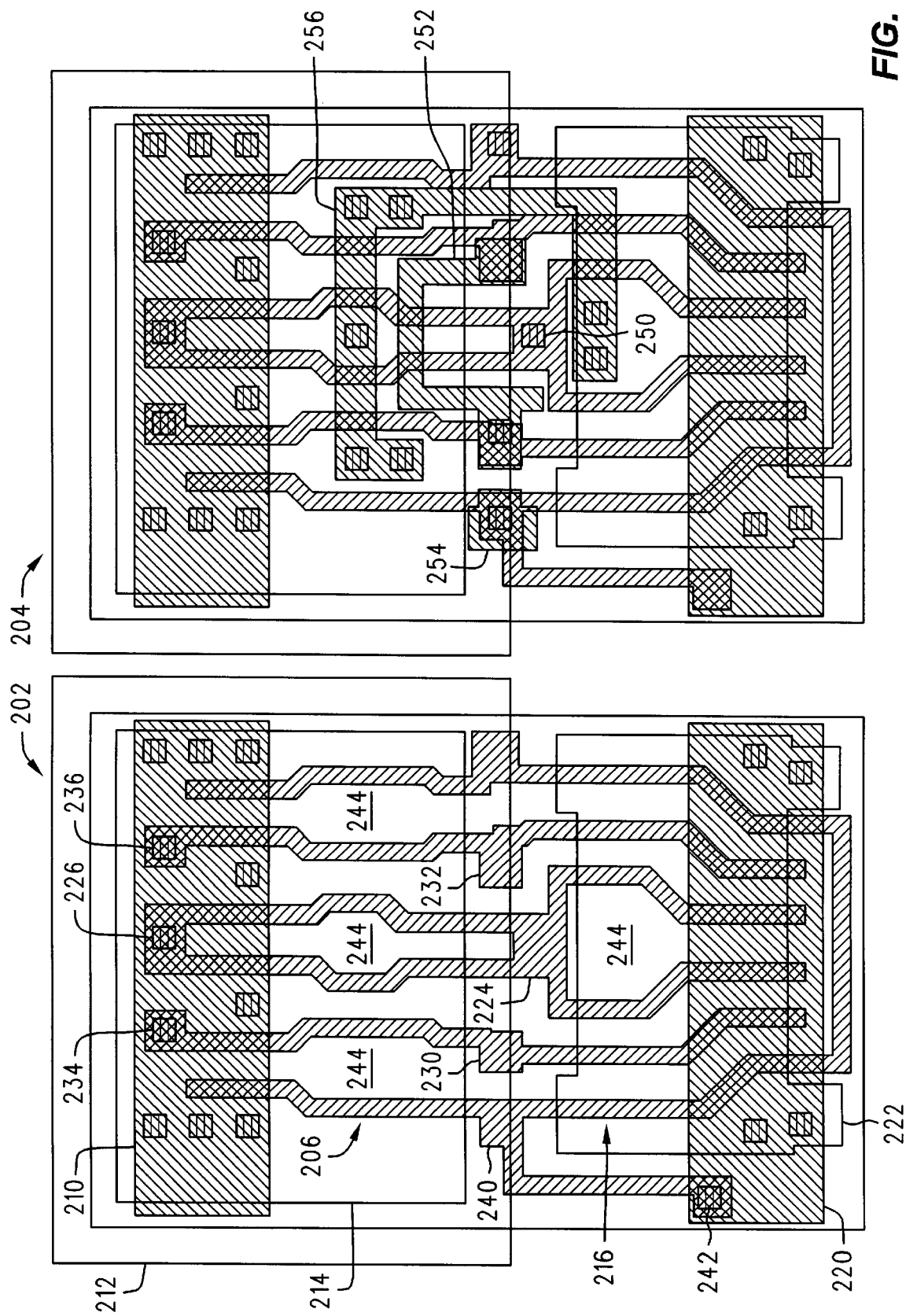
FIG. 7 is a schematic representation of a spacer cell with a three input nand gate in a tied-down configuration and in a fully-connected configuration.

Referring now to FIG. 7, a spacer cell with a three input nand gate is illustrated in both a tied-down configuration 202 and a fully connected configuration 204. A series of polysilicon pfets 206 is located with a power conductor 210 in an n-well active region 214 inside an n-well 212, and a series of polysilicon nfets 216 is located with a ground conductor 220 in a non n-well active region 222. In the tied-down configuration 202, the first input 224 is tied to power 210 by a metal connector 226, the second input 230 and 232 is tied to power 210 by metal connectors 234 and 236, and the third input 240 is tied to ground 220 by a metal connector 242. The unconnected outputs 244 are therefore held in a high state, preventing them from floating.

In the fully connected configuration 204, the metal connectors 226, 234, 236, and 242 are removed which were tying the inputs 224, 230, 232, and 240 to power 210 and ground 220. The first input 224 is available on metal connection 250 for connection to other logic cells. The second input 230 and 232 is internally connected by a metal strap 252, and the third input 240 is available on metal strap 254 for connection to other logic cells. The output locations 244 are interconnected by a metal strap 256, and may be connected to other logic cells, preferably on another metal layer. As with the two input nand gate described previously, the structure of the spacer cell is identical below the metal and connector layers in the tied-down and fully-connected configurations.

Figure 8:
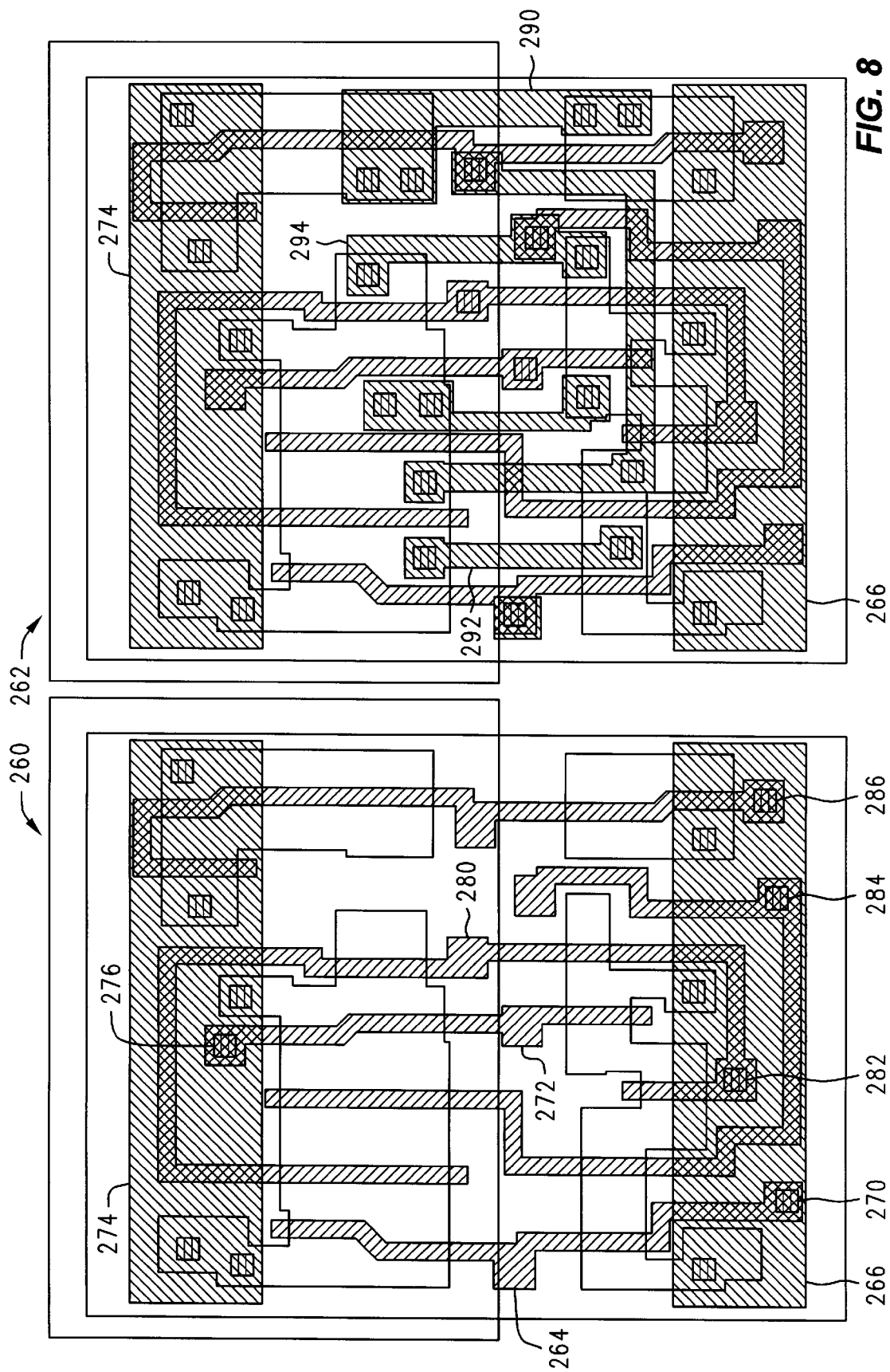
FIG. 8 is a schematic representation of a spacer cell with a two input multiplexer in a tied-down configuration and in a fully-connected configuration.

Referring now to FIG. 8, a spacer cell with a two input multiplexer is illustrated in both a tied-down configuration 260 and a fully connected configuration 262. In the tied-down configuration 260, the first input 264 is tied to ground 266 by a metal connector 270, the second input 272 is tied to power 274 by a metal connector 276, and the select line 280 is tied to ground 266 by a metal connector 282. Other intermediate nodes are tied to ground 266 by metal connectors 284 and 286.

In the fully connected configuration 262, the metal connectors 270, 276, 282, 284, and 286 are removed so that the circuit can operate based on the two inputs 264 and 272 and the select line 280. A metal output strap 290 is provided, and the gate is fully internally connected with various metal straps (e.g., 292, 294) as needed. As with the two input nand gate described previously, the structure of the spacer cell is identical below the metal and connector layers in the tied-down and fully-connected configurations.

The spacer cells having spare logic gates, both in tied-down and fully-connected configurations, may be included in a library file for most place and route software tools. The spacer cells may be provided to a place and route software tool in any required fashion. Following are examples of macros defining spacer cells with spare logic gates for the Silicon Ensemble® place and route software.

The following two macros are an example of a two input nand spacer cell, typically placed in a library file for use with place and route software. The first macro for "fill_nand2ii_huge2" defines a two input nand gate tied down into an inactive state. The second macro for "nand2ii_huge2" defines an internally fully connected two input nand gate which may be connected to other logic cells.

```
MACRO fill_nand2ii_huge2
    CLASS CORE ;
    FOREIGN fill_nand2ii huge2 0.000 -1.200
    ORIGIN 0.000 1.200 ;
    SIZE 9.800 BY 16.800 ;
    SITE CORE10 ;
    SYMMETRY X Y ;
    PIN GND
        DIRECTION INPUT ;
        USE GROUND ;
        SHAPE ABUTMENT ;
        PORT
            LAYER metal1 ;
                RECT    0.000   -0.250   9.800    2.650  ;
        END
    END GND
    PIN VDD
        DIRECTION INPUT ;
        USE POWER ;
        SHAPE ABUTMENT ;
        PORT
            LAYER metal1 ;
                RECT    0.000   11.750   9.800   14.650  ;
        END
    END VDD
    OBS
        LAYER cont1 ;
            RECT    8.750   13.950   9.250   14.450  ;
            RECT    6.050   13.950   6.550   14.450  ;
            RECT    3.350   13.950   3.850   14.450  ;
            RECT    0.550   13.950   1.050   14.450  ;
            RECT    8.750   12.950   9.250   13.450  ;
            RECT    6.050   12.950   6.550   13.450  ;
            RECT    3.350   12.950   3.850   13.450  ;
            RECT    0.550   12.950   1.050   13.450  ;
            RECT    8.750   11.950   9.250   12.450  ;
            RECT    6.050   11.950   6.550   12.450  ;
            RECT    3.350   11.950   3.850   12.450  ;
            RECT    0.550   11.950   1.050   12.450  ;
            RECT    6.050    1.950   6.550    2.450  ;
            RECT    0.550    1.950   1.050    2.450  ;
            RECT    6.050    0.950   6.550    1.450  ;
            RECT    0.550    0.950   1.050    1.450  ;
            RECT    6.050   -0.050   6.550    0.450  ;
            RECT    3.450    0.300   3.950    0.800  ;
            RECT    8.650   -0.050   9.150    0.450  ;
            RECT    7.150   -0.050   7.650    0.450  ;
    END
END fill_nand2ii huge2
MACRO nand2ii_huge2
    CLASS CORE ;
    FOREIGN.nand2ii_huge2 0.000 -1.200 ;
    ORIGIN 0.000 1.200 ;
    SIZE 9.800 BY 16.800 ;
    SITE CORE10 ;
    SYMMETRY X Y ;
    PIN A
        DIRECTION INPUT ;
        USE SIGNAL ;
        PORT
            LAYER metal1 ;
                RECT    3.050    9.350   9.500    9.850  ;
                RECT    8.850    6.650   9.500    9.350  ;
                RECT    8.600    5.750   9.500    6.650  ;
                RECT    3.050    6.650   3.750    9.350  ;
                RECT    3.050    5.750   3.950    6.650  ;
        END
    END A
    PIN B
        DIRECTION INPUT ;
        USE SIGNAL ;
        PORT
            LAYER metal1 ;
                RECT    0.300    5.750   1.200    6.650  ;
                RECT    5.850    3.650   6.750    7.250  ;
                RECT    0.300    3.650   0.950    5.750  ;
                RECT    0.300    3.150   6.750    3.650  ;
        END
    END B
```

```
    PIN GND
        DIRECTION INPUT ;
        USE GROUND ;
        SHAPE ABUTMENT ;
        PORT
            LAYER metal1 ;
                RECT    0.000   -0.250    9.800    2.650  ;
        END
    END GND
    PIN Q
        DIRECTION INPUT ;
        USE SIGNAL ;
        PORT
            LAYER metal1 ;
                RECT    1.650    7.950    2.550    9.850  ;
                RECT    4.450    7.750    8.150    8.650  ;
                RECT    7.250    5.050    8.100    7.750  ;
                RECT    7.250    3.150    9.450    5.050  ;
                RECT    4.450    5.050    5.350    7.750  ;
                RECT    1.750    5.050    2.550    7.950  ;
                RECT    1.750    4.150    5.350    5.050  ;
        END
    END Q
    PIN VDD
        DIRECTION INPUT ;
        USE POWER ;
        SHAPE ABUTMENT ;
        PORT
            LAYER metal1 ;
                RECT    0.000   11.750    9.800   14.650  ;
        END
    END VDD
    OBS
        LAYER cont1 ;
            RECT    8.750   13.950    9.250   14.450  ;
            RECT    6.050   13.950    6.550   14.450  ;
            RECT    3.350   13.950    3.850   14.450  ;
            RECT    0.550   13.950    1.050   14.450  ;
            RECT    8.750   12.950    9.250   13.450  ;
            RECT    6.050   12.950    6.550   13.450  ;
            RECT    3.350   12.950    3.850   13.450  ;
            RECT    0.550   12.950    1.050   13.450  ;
            RECT    8.750   11.950    9.250   12.450  ;
            RECT    6.050   11.950    6.550   12.450  ;
            RECT    3.350   11.950    3.850   12.450  ;
            RECT    0.550   11.950    1.050   12.450  ;
            RECT    1.850    9.150    2.350    9.650  ;
            RECT    1.850    8.150    2.350    8.650  ;
            RECT    7.450    7.950    7.950    8.450  ;
            RECT    4.650    7.950    5.150    8.450  ;
            RECT    8.750    4.350    9.250    4.850  ;
            RECT    3.950    4.350    4.450    4.850  ;
            RECT    2.950    4.350    3.450    4.850  ;
            RECT    8.750    3.350    9.250    3.850  ;
            RECT    6.050    1.950    6.550    2.450  ;
            RECT    0.550    1.950    1.050    2.450  ;
            RECT    6.050    0.950    6.550    1.450  ;
            RECT    0.550    0.950    1.050    1.450  ;
            RECT    6.050   -0.050    6.550    0.450 ;
            RECT    6.050    6.550    6.550    7.050  ;
            RECT    8.800    5.950    9.300    6.450  ;
            RECT    3.250    5.950    3.750    6.450  ;
            RECT    0.500    5.950    1.000    6.450  ;
    END
END nand2ii_huge2
```

The following two macros are an example of an inverter spacer cell, typically placed in a library file for use with place and route software. The first macro for "fill_invjj_huge1" defines an inverter tied down into an inactive state. The second macro for "invjj_huge1" defines an internally fully connected inverter which may be connected to other logic cells.

```
MACRO fill_invjj_huge1
    CLASS CORE ;
    FOREIGN fill_invjj_huge1 0.000 -1.200 ;
    ORIGIN 0.000 1.200 ;
    SIZE 8.400 BY 16.800 ;
    SITE CORE10 ;
    SYMMETRY X Y ;
    PIN GND
        DIRECTION INPUT ;
        USE GROUND ;
        SHAPE ABUTMENT ;
        PORT
            LAYER metal1 ;
                RECT    0.000   -0.250    8.400    2.650  ;
        END
    END GND
    PIN VDD
        DIRECTION INPUT ;
        USE POWER ;
        SHAPE ABUTMENT ;
        PORT
            LAYER metal1 ;
                RECT    0.000   11.750    8.400   14.650  ;
        END
    END VDD
    OBS
        LAYER cont1 ;
            RECT    6.050   13.950    6.550   14.450  ;
            RECT    3.250   13.950    3.750   14.450  ;
            RECT    1.750   13.820    2.250   14.320  ;
            RECT    0.500   14.070    1.000   14.570  ;
            RECT    0.550   13.820    1.050   14.320  ;
            RECT    6.050   12.950    6.550   13.450  ;
            RECT    3.250   12.950    3.750   13.450  ;
            RECT    0.550   12.950    1.050   13.450  ;
            RECT    6.050   11.950    6.550   12.450  ;
            RECT    3.250   11.950    3.750   12.450  ;
            RECT    0.550   11.950    1.050   12.450  ;
            RECT    6.550    1.950    7.050    2.450  ;
            RECT    3.400    1.950    3.900    2.450  ;
            RECT    0.550    1.950    1.050    2.450  ;
            RECT    6.550    0.950    7.050    1.450  ;
            RECT    3.400    0.950    3.900    1.450  ;
            RECT    0.550    0.950    1.050    1.450  ;
            RECT    0.550   -0.050    1.050    0.450  ;
            RECT    1.750   14.070    2.250   14.570  ;
            RECT    0.750   14.070    1.250   14.570  ;
            RECT    6.550   -0.050    7.050    0.450  ;
            RECT    3.400   -0.050    3.900    0.450  ;
            RECT    1.950    0.700    2.450    1.200  ;
    END
END fill_invjj_huge1
MACRO invjj_huge1
    CLASS CORE ;
    FOREIGN invjj_huge1 0.000 -1.200 ;
    ORIGIN 0.000 1.200 ;
    SIZE 8.400 BY 16.800 ;
    SITE CORE10 ;
    SYMMETRY X Y ;
    PIN A
        DIRECTION INPUT ;
        USE SIGNAL ;
        PORT
            LAYER metal1 ;
                RECT    3.050    5.750    3.950    7.100  ;
        END
    END A
    PIN GND
        DIRECTION INPUT ;
        USE GROUND ;
        SHAPE ABUTMENT ;
        PORT
            LAYER metal1 ;
                RECT    0.000   -0.250    8.400    2.650  ;
        END
    END GND
    PIN Q
        DIRECTION INPUT ;
        USE SIGNAL ;
```

```
                        -continued
              PORT
                LAYER metal1 ;
                    RECT   1.550    9.050    8.150    9.850 ;
                    RECT   4.350    7.900    5.250    9.050 ;
                    RECT   1.550    7.400    2.550    9.050 ;
                    RECT   1.650    5.200    2.550    7.400 ;
                    RECT   7.150    4.050    8.150    9.050 ;
                    RECT   4.550    4.050    5.450    5.050 ;
                    RECT   4.550    3.850    8.150    4.050 ;
                    RECT   1.650    3.850    2.650    5.200 ;
                    RECT   1.650    3.150    8.150    3.850 ;
              END
          END Q
          PIN VDD
              DIRECTION INPUT ;
              USE POWER ;
              SHAPE ABUTMENT ;
              PORT
                LAYER metal1 ;
                    RECT   0.000   11.750    8.400   14.650 ;
              END
          END VDD
          OBS
              LAYER cont1 ;
                    RECT   6.050   13.950    6.550   14.450 ;
                    RECT   3.250   13.950    3.750   14.450 ;
                    RECT   1.750   13.820    2.250   14.320 ;
                    RECT   0.500   14.070    1.000   14.570 ;
                    RECT   0.550   13.820    1.050   14.320 ;
                    RECT   6.050   12.950    6.550   13.450 ;
                    RECT   3.250   12.950    3.750   13.450 ;
                    RECT   0.550   12.950    1.050   13.450 ;
                    RECT   6.050   11.950    6.550   12.450 ;
                    RECT   3.250   11.950    3.750   12.450 ;
                    RECT   0.550   11.950    1.050   12.450 ;
                    RECT   7.350    9.100    7.850    9.600 ;
                    RECT   4.550    9.100    5.050    9.600 ;
                    RECT   1.750    9.050    2.250    9.550 ;
                    RECT   7.350    8.100    7.850    8.600 ;
                    RECT   4.550    8.100    5.050    8.600 ;
                    RECT   1.750    8.050    2.250    8.550 ;
                    RECT   1.950    4.500    2.450    5.000 ;
                    RECT   4.750    4.350    5.250    4.850 ;
                    RECT   1.950    3.500    2.450    4.000 ;
                    RECT   4.800    3.350    5.300    3.850 ;
                    RECT   6.550    1.950    7.050    2.450 ;
                    RECT   3.400    1.950    3.900    2.450 ;
                    RECT   0.550    1.950    1.050    2.450 ;
                    RECT   6.550    0.950    7.050    1.450 ;
                    RECT   3.400    0.950    3.900    1.450 ;
                    RECT   0.550    0.950    1.050    1.450 ;
                    RECT   0.550   -0.050    1.050    0.450 ;
                    RECT   1.750   14.070    2.250   14.570 ;
                    RECT   0.750   14.070    1.250   14.570 ;
                    RECT   6.550   -0.050    7.050    0.450 ;
                    RECT   3.400   -0.050    3.900    0.450 ;
                    RECT   3.250    6.400    3.750    6.900 ;
          END
      END invjj_huge1
```

The following two macros are an example of a three input nand spacer cell, typically placed in a library file for use with place and route software. The first macro for "fill_nand3gg_huge3" defines a three input nand tied down into an inactive state. The second macro for "nand3gg_huge3" defines an internally fully connected three input nand which may be connected to other logic cells.

```
MACRO fill_nand3gg_huge3
    CLASS CORE ;
    FOREIGN fill nand3gg_huge3 0.000 -1.200 ;
    ORIGIN 0.000 1.200 ;
    SIZE 11.200 BY 16.800 ;
    SITE CORE10 ;
    SYMMETRY X Y ;
    PIN GND
      DIRECTION INPUT ;
      USE GROUND ;
      SHAPE ABUTMENT ;
      PORT
        LAYER metal1 ;
            RECT   0.000   -0.250   11.200    2.650 ;
      END
    END GND
    PIN VDD
      DIRECTION INPUT ;
      USE POWER ;
      SHAPE ABUTMENT ;
      PORT
        LAYER metal1 ;
            RECT   0.000   11.750   11.200   14.650 ;
      END
    END VDD
    OBS
        LAYER cont1 ;
            RECT  10.150   13.950   10.650   14.450 ;
            RECT   1.950   13.950    2.450   14.450 ;
            RECT  10.150   12.950   10.650   13.450 ;
            RECT   1.950   12.950    2.450   13.450 ;
            RECT  10.150   11.950   10.650   12.450 ;
            RECT   7.450   11.950    7.950   12.450 ;
            RECT   4.650   11.950    5.150   12.450 ;
            RECT   1.950   11.950    2.450   12.450 ;
            RECT  10.150    0.950   10.650    1.450 ;
            RECT   1.950    0.950    2.450    1.450 ;
            RECT   2.150    0.180    2.650    0.680 ;
            RECT   9.800    0.180   10.300    0.680 ;
            RECT   9.630   -0.070   10.130    0.430 ;
            RECT   9.870   -0.070   10.370    0.430 ;
            RECT   2.150   -0.070    2.650    0.430 ;
            RECT   8.050   13.700    8.550   14.200 ;
            RECT   6.050   13.700    6.550   14.200 ;
            RECT   4.050   13.700    4.550   14.200 ;
            RECT   0.500    1.950    1.000    2.450 ;
    END
END fill_nand3gg_huge3
MACRO nand3gg_huge3
    CLASS CORE ;
    FOREIGN nand3gg_huge3 0.000 -1.200 ;
    ORIGIN 0.000 1.200 ;
    SIZE 11.200 BY 162800 ;
    SITE CORE10 ;
    SYMMETRY X Y ;
    PIN A
      DIRECTION INPUT ;
      USE SIGNAL ;
      PORT
        LAYER metal1 ;
            RECT   5.850    5.550    6.750    7.450 ;
      END
    END A
    PIN B
      DIRECTION INPUT ;
      USE SIGNAL ;
      PORT
        LAYER metal1 ;
            RECT   4.650    8.350    7.950    8.850 ;
            RECT   7.450    7.150    7.950    8.350 ;
            RECT   7.450    6.250    8.400    7.150 ;
            RECT   4.650    7.150    5.150    8.350 ;
            RECT   3.450    6.250    5.150    7.150 ;
            RECT   4.650    5.750    5.150    6.250 ;
      END
    END B
    PIN C
      DIRECTION INPUT ;
      USE SIGNAL ;
      PORT
        LAYER metal1 ;
            RECT  10.450    7.206   10.950    7.300 ;
            RECT   1.650    7.150    2.550    7.450 ;
            RECT  10.000    6.300   10.950    7.200 ;
            RECT   1.650    6.250    2.750    7.150 ;
```

-continued

```
        RECT    10.450   3.650    10.950   6.300 ;
        RECT    1.650    3.650    2.550    6.250 ;
        RECT    1.650    3.150    10.950   3.650 ;
     END
  END C
  PIN GND
     DIRECTION INPUT ;
     USE GROUND ;
     SHAPE ABUTMENT ;
     PORT
        LAYER metal1 ;
        RECT    0.000    −0.250   11.200   2.650 ;
     END
  END GND
  PIN Q
     DIRECTION INPUT ;
     USE SIGNAL ;
     PORT
        LAYER metal1 ;
        RECT    3.100    9.350    9.500    10.250 ;
        RECT    8.600    8.350    9.500    9.350 ;
        RECT    8.900    5.050    9.500    8.350 ;
        RECT    5.300    4.150    9.500    5.050 ;
        RECT    3.100    8.350    4.000    9.350 ;
     END
  END Q
  PIN VDD
     DIRECTION INPUT
     USE POWER ;
     SHAPE ABUTMENT ;
     PORT
        LAYER metal1 ;
        RECT    0.000    11.750   11.200   14.650 ;
     END
  END VDD
  OBS
     LAYER cont1 ;
        RECT    10.150   13.950   10.650   14.450 ;
        RECT    1.950    13.950   2.450    14.450 ;
        RECT    10.150   12.950   10.650   13.450 ;
        RECT    1.950    12.950   2.450    13.450 ;
        RECT    10.150   11.950   10.650   12.450 ;
        RECT    7.450    11.950   7.950    12.450 ;
        RECT    4.650    11.950   5.150    12.450 ;
        RECT    1.950    11.950   2.450    12.450 ;
        RECT    8.800    9.550    9.300    10.050 ;
        RECT    6.000    9.550    6.500    10.050 ;
        RECT    3.300    9.550    3.800    10.050 ;
        RECT    8.800    8.550    9.300    9.050 ;
        RECT    3.300    8.550    3.800    9.050 ;
        RECT    6.550    4.350    7.050    4.850 ;
        RECT    5.550    4.350    6.050    4.850 ;
        RECT    10.150   0.950    10.650   1.450 ;
        RECT    1.950    0.950    2.450    1.450 ;
        RECT    2.150    0.180    2.650    0.680 ;
        RECT    9.800    0.180    10.300   0.680 ;
        RECT    9.630    −0.070   10.130   0.430 ;
        RECT    9.870    −0.070   10.370   0.430 ;
        RECT    2.150    −0.070   2.650    0.430 ;
        RECT    10.200   6.500    10.700   7.000 ;
        RECT    7.700    6.450    8.200    6.950 ;
        RECT    3.650    6.450    4.150    6.950 ;
        RECT    2.050    6.450    2.550    6.950 ;
        RECT    6.050    5.750    6.550    6.250 ;
     END
END nand3gg_huge3
```

The following two macros are an example of a two input multiplexer spacer cell, typically placed in a library file for use with place and route software. The first macro for "fill_mux2neff_huge4" defines a two input multiplexer tied down into an inactive state. The second macro for "mux2neff_huge4" defines an internally fully connected two input multiplexer which may be connected to other logic cells.

```
MACRO fill_mux2neff_huge4
   CLASS CORE ;
   FOREIGN fill_mux2neff_huge4 0.000 −1.200 ;
   ORIGIN 0.000 1.200 ;
   SIZE 12.600 BY 16.800 ;
   SITE CORE10 ;
   SYMMETRY X Y ;
   PIN GND
      DIRECTION INPUT ;
      USE GROUND ;
      SHAPE ABUTMENT ;
      PORT
         LAYER metal1 ;
         RECT    0.000    −0.250   12.600   2.650 ;
      END
   END GND
   PIN VDD
      DIRECTION INPUT ;
      USE POWER ;
      SHAPE ABUTMENT ;
      PORT
         LAYER metal1 ;
         RECT    0.000    11.750   12.600   14.650 ;
      END
   END VDD
   OBS
      LAYER cont1 ;
         RECT    11.550   13.250   12.050   13.750 ;
         RECT    8.550    12.850   9.050    13.350 ;
         RECT    6.550    11.950   7.050    12.450 ;
         RECT    0.550    11.950   1.050    12.450 ;
         RECT    6.750    1.956    7.250    2.450 ;
         RECT    0.550    1.800    1.050    2.300 ;
         RECT    10.150   1.700    10.650   2.200 ;
         RECT    0.950    13.100   1.450    13.600 ;
         RECT    5.450    12.300   5.950    12.800 ;
         RECT    4.800    1.050    5.300    1.550 ;
         RECT    11.000   0.400    11.500   0.900 ;
         RECT    8.850    0.050    9.350    0.550 ;
         RECT    2.100    −0.050   2.600    0.450 ;
      END
END fill_mux2neff_huge4
MACRO mux2neff_huge4
   CLASS CORE ;
   FOREIGN mux2neff_huge4 0.000 −1.200 ;
   ORIGIN 0.000 1.200 ;
   SIZE 12.600 BY 16.800 ;
   SITE CORE10 ;
   SYMMETRY X Y ;
   PIN A
      DIRECTION INPUT ;
      USE SIGNAL ;
      PORT
         LAYER metal1 ;
         RECT    7.250    5.750    8.150.   7.650 ;
      END
   END A
   PIN GND
      DIRECTION INPUT ;
      USE GROUND ;
      SHAPE ABUTMENT ;
      PORT
         LAYER metal1 ;
         RECT    0.000    −0.250   12.600   2.650 ;
      END
   END GND
   PIN Q
      DIRECTION INPUT ;
      USE SIGNAL ;
      PORT
         LAYER metal1 ;
         RECT    9.950    7.950    12.350   9.850 ;
         RECT    11.550   5.050    12.350   7.950 ;
         RECT    11.350   3.150    12.350   5.050 ;
      END
   END Q
   PIN VDD
      DIRECTION INPUT ;
      USE POWER ;
```

-continued

```
    SHAPE ABUTMENT ;
    PORT
      LAYER metal1 ;
        RECT    0.000    11.750   12.600   14.650 ;
      END
    END VDD
    PIN Y0
      DIRECTION INPUT ;
      USE SIGNAL ;
      PORT
        LAYER metal1 ;
          RECT   0.250    5.750    1.200    6.650 ;
        END
    END Y0
    PIN Y1
      DIRECTION INPUT ;
      USE SIGNAL ;
      PORT
        LAYER metal1 ;
          RECT   5.750    5.550    6.650    6.450 ;
        END
    END Y1
    OBS
      LAYER cont1
        RECT   11.550   13.250   12.050   13.750 ;
        RECT    8.550   12.850    9.050   13.350 ;
        RECT    6.550   11.950    7.050   12.450 ;
        RECT    0.550   11.950    1.050   12.450 ;
        RECT   10.150    9.150   10.650    9.650 ;
        RECT    8.050    9.150    8.550    9.650 ;
        RECT    5.150    8.800    5.650    9.300 ;
        RECT   10.150    8.150   10.650    8.650 ;
        RECT    3.450    7.950    3.950    8.450 ;
        RECT    1.750    7.950    2;250    8.450 ;
        RECT    5.150    7.800    5.650    8.300 ;
        RECT   11.550    4.350   12.050    4.850 ;
        RECT    8.450    4.350    8.950    4.850 ;
        RECT    5.350    4.350    5.850    4.850 ;
        RECT    2.000    3.650    2.500    4.150 ;
        RECT   11.550    3.350   12.050    3.850 ;
        RECT    3.700    3.350    4.200    3.850 ;
        RECT    6.750    1.950    7.250    2.450 ;
        RECT    0.550    1.800    1.050    2.300 ;
        RECT   10.150    1.760   10.650    2.200 ;
        RECT    0.950   13.100    1.450   13.600 ;
        RECT    7.450    6.950    7.950    7.450 ;
        RECT   10.350    6.750   10.850    7.250 ;
        RECT    0.500    5.950    1.000    6.450 ;
        RECT    5.950    5.750    6.450    6.250 ;
        RECT    8.850    5.450    9.350    5.950 ;
      LAYER metal1 ;
        RECT    7.850    8.950    9.150    9.850 ;
        RECT    8.650    7.450    9.150    8.950 ;
        RECT    8.650    6.200    9.200    7.450 ;
        RECT    8.650    5.200    9.600    6.200 ;
        RECT    8.650    5.050    9.300    5.200 ;
        RECT    8.250    4.100    9.300    5.050 ;
        RECT    1.550    7.750    2.500    8.650 ;
        RECT    1.800    7.700    2.500    7.750 ;
        RECT    1.800    4.400    2.350    7.700 ;
        RECT    1.800    3.450    2.750    4.400 ;
        RECT    3.200    7.700    4.200    8.650 ;
        RECT   10.000    6.550   11.050    7.450 ;
        RECT    3.450    4.100    4.150    7.700 ;
        RECT   10.000    3.700   10.550    6.550 ;
        RECT    3.450    3.700    4.450    4.100 ;
        RECT    8.250    3.650   10.550    3.700 ;
        RECT    3.450    3.650    6.050    3.700 ;
        RECT    3.450    3.450   10.550    3.650 ;
        RECT    3.500    3.150   10.550    3.450 ;
        RECT    4.750    7.600    5.850    9.500 ;
        RECT    4.700    5.050    5.250    7.600 ;
        RECT    4.700    4.500    6.050    5.050 ;
        RECT    5.100    4.100    6.050    4.500 ;
    END
mux2neff_huge4
```

While illustrative and presently preferred embodiments of the invention have been described in detail herein, it is to be understood that the inventive concepts may be otherwise variously embodied and employed, and that the appended claims are intended to be construed to include such variations, except as limited by the prior art.

What is claimed is:

1. A method for designing an integrated circuit having spare logic gates, comprising:

placing a plurality of logic cells on an area of said integrated circuit;

placing a plurality of spacer cells among said plurality of logic cells to fill a plurality of empty spaces between said plurality of logic cells; and routing a plurality of electrical connections among said plurality of logic cells and said plurality of spacer cells to form said integrated circuit.

2. The method of claim 1, wherein a portion of said plurality of spacer cells contain spare logic gates, each of said spare logic gates having one or more inputs, said one or more inputs being connected to a ground so that said spare logic gates are in an inactive state.

3. The method of claim 1, wherein a portion of said plurality of spacer cells contain spare logic gates, each of said spare logic gates having one or more inputs and one or more outputs, said one or more inputs and said one or more outputs being connected to said plurality of logic cells so that said spare logic gates are in an active state.

4. A method of manufacturing an integrated circuit, comprising:

a. placing and routing a plurality of logic cells and a plurality of spacer cells in an integrated circuit design, said spacer cells comprising one or more spare logic gates configured in an inactive state; and b. fabricating one or more integrated circuits according to said integrated circuit design.

5. The method of claim 4, further comprising:

a. testing said one or more integrated circuits;

b. if a design fault is found in said one or more integrated circuits, correcting said design fault by:

i. replacing one or more of said spacer cells with one or more fully connected spacer cells having one or more spare logic gates configured in an active state, wherein said one or more spacer cells and said one or more fully connected spacer cells perform a same logic function;

ii. rerouting said one or more spacer cells to connect them to said plurality of logic cells; and c. fabricating one or more corrected integrated circuits.

6. Apparatus for placing and routing an integrated circuit, the apparatus comprising:

a. one or more computer readable storage media; and b. computer readable program code stored in the one or more computer readable storage media, the computer readable code comprising:

i. code for placing a plurality of logic cells in said integrated circuit; and ii. code for placing one or more spacer cells in said integrated circuit to fill one or more empty spaces between said plurality of logic cells, wherein said one or more spacer cells comprise a spare logic gate.

7. Apparatus as in claim 6, wherein said plurality of spacer cells comprise a plurality of different sizes, and wherein said code for placing one or more spacer cells selects one of said plurality of spacer cells based on said plurality of different sizes.

8. Apparatus as in claim 6, wherein said spare logic gate is configured in an inactive state.

9. Apparatus as in claim 6, wherein said spare logic gate is configured in an active state.

10. Apparatus as in claim 6, wherein said spare logic gate comprises one or more transistors.

11. Apparatus as in claim 10, wherein said one or more transistors include one or more inputs, and wherein said one or more inputs are connected to a ground to prevent one or more outputs of said one or more transistors from floating.

12. Apparatus as in claim 10, wherein said one or more transistors include one or more inputs, and wherein said one or more inputs are connected to a power source to prevent one or more outputs of said one or more transistors from floating.

13. Apparatus as in claim 10, wherein said one or more transistors comprise one or more polysilicon gates.

14. Apparatus as in claim 10, wherein said one or more transistors are connected by one or more metal connectors.

15. Apparatus as in claim 1, wherein said spare logic gate comprises one or more transistors and wherein said one or more transistors are connected to perform a logic function.

16. Apparatus as in claim 6, wherein said spare logic gate comprises an inverter.

17. Apparatus as in claim 6, wherein said spare logic gate comprises a two input nand gate.

18. Apparatus as in claim 6, wherein said spare logic gate comprises a three input nand gate.

19. Apparatus as in claim 6, wherein said spare logic gate comprises a multiplexer.

20. An apparatus for designing an integrated circuit having spare logic gates, comprising:

a means for placing a plurality of logic cells on an area of said integrated circuit;

a means for placing a plurality of spacer cells among said plurality of logic cells to fill a plurality of empty spaces between said plurality of logic cells; and a means for routing a plurality of electrical connections among said plurality of logic cells and said plurality of spacer cells to form said integrated circuit.

21. An apparatus for designing an integrated circuit having spare logic gates, comprising:

an assembly which places a plurality of logic cells on an area of said integrated circuit;

an assembly which places a plurality of spacer cells among said plurality of logic cells to fill a plurality of empty spaces between said plurality of logic cells;

an assembly which routes a plurality of electrical connections among said plurality of logic cells and said plurality of spacer cells to form said integrated circuit.

22. A computer data signal embodied in a transmission medium comprising computer source code defining one or more spacer cells to be placed in a design for an integrated circuit, said one or more spacer cells for filling one or more empty spaces in said design, wherein said one or more spacer cells comprise a spare logic gate.

\* \* \* \* \*